United States Patent [19]

Higgins, III et al.

[11] Patent Number: 5,029,325
[45] Date of Patent: Jul. 2, 1991

[54] TAB TAPE TRANSLATOR FOR USE WITH SEMICONDUCTOR DEVICES

[75] Inventors: Leo M. Higgins, III; Michael B. McShane, both of Austin, Tex.

[73] Assignee: Motorola, Inc., Schaumburg, Ill.

[21] Appl. No.: 575,751

[22] Filed: Aug. 31, 1990

[51] Int. Cl.$^5$ ............................................. H01L 39/02
[52] U.S. Cl. ........................................ 357/80; 357/74; 357/75; 357/70
[58] Field of Search ..................... 357/74, 75, 70, 80

[56] References Cited

U.S. PATENT DOCUMENTS

| | | | |
|---|---|---|---|
| 3,611,061 | 10/1971 | Segerson | 317/234 |
| 3,683,105 | 8/1972 | Shamash et al. | 357/75 |
| 3,689,991 | 9/1972 | Aird | 20/577 |
| 3,724,068 | 4/1973 | Galli | 357/74 |
| 3,868,724 | 2/1975 | Perrino | 357/70 |
| 4,649,415 | 3/1987 | Herbert | 357/74 |
| 4,887,148 | 12/1989 | Mu | 357/74 |

OTHER PUBLICATIONS

Nitto Product Information New Tab Mounting Method.

Primary Examiner—Andrew J. James
Assistant Examiner—T. Davenport
Attorney, Agent, or Firm—Raymond J. Warren

[57] ABSTRACT

A first plurality of contacts are disposed on a first surface of a flexible tape in a pattern matching the pattern of the contacts of a semiconductor die. A second plurality of contacts are disposed on a second surface of the flexible tape in a pattern matching the pattern of the contacts of a substrate. The first and second plurality of contacts are then coupled by conductive lines disposed on the surfaces of the flexible tape and extending through the conductive tape.

19 Claims, 2 Drawing Sheets

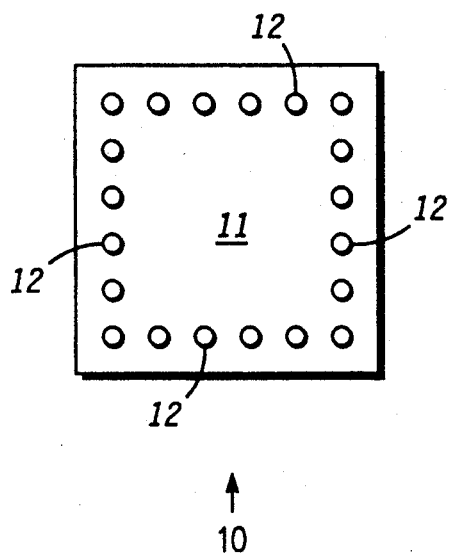
FIG. 1
—PRIOR ART—
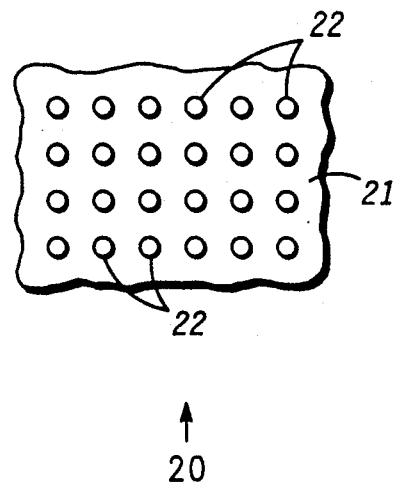
FIG. 2
—PRIOR ART—
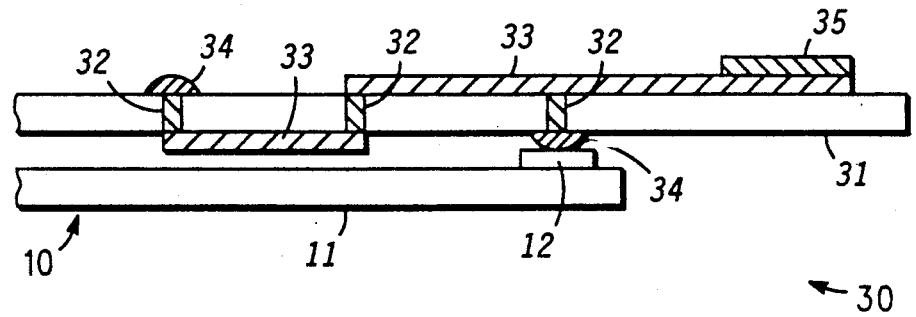
FIG. 3
FIG. 4
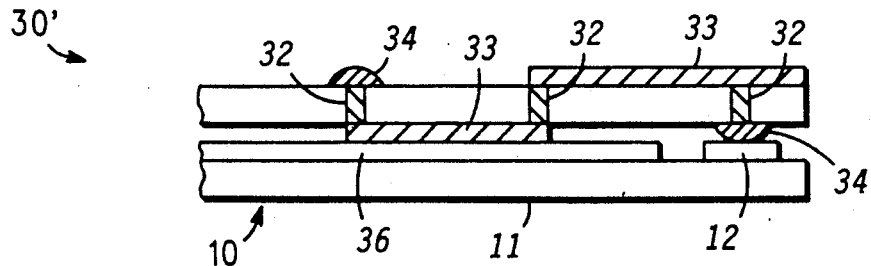

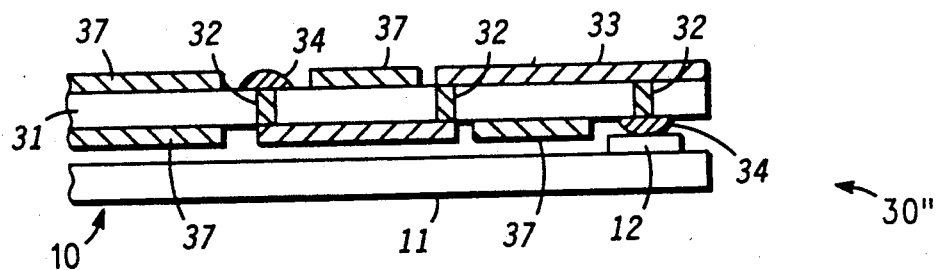
FIG. 5
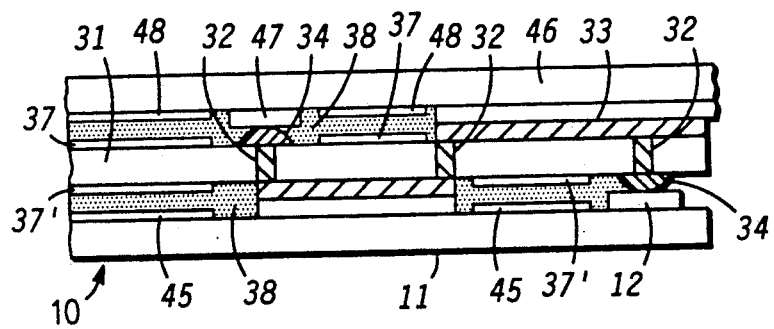
FIG. 6
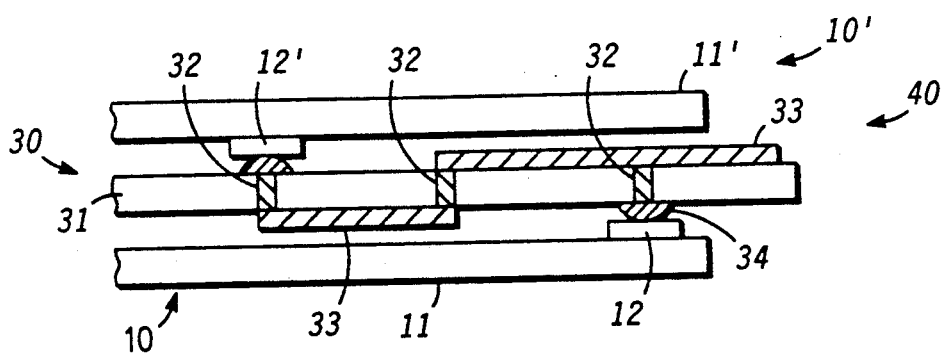
FIG. 7
FIG. 8
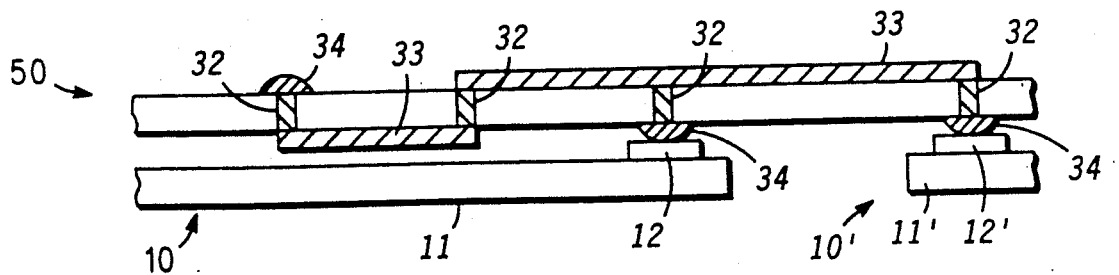

TAB TAPE TRANSLATOR FOR USE WITH SEMICONDUCTOR DEVICES

FIELD OF THE INVENTION

The present invention relates, in general, to tape automated bonding (TAB) tape and, more particularly, a TAB tape translator for use with semiconductor devices.

BACKGROUND OF THE INVENTION

Semiconductor chips or integrated circuit (IC) dies generally have multiple electrical contact pads fabricated therein in order to provide a contact for external leads. The contact pads are typically provided in one of two configurations. The first is for edge contacts where the contacts are provided along at least one edge of a surface of the die. The second is for array contacts which are disposed on the surface of the die in an array format.

The contacts are then coupled to external electrical leads or thin film conductors which provide electrical contact from the die to the exterior of the package housing the die. The leads would then be inserted or bonded to a printed circuit board or the like.

In production processes, tape automated bonding has been employed where a strip of metal tape in a reel form provides a plurality of groups of metallic parts where each group includes interconnected finger contacts. These are connected at inner beam ends to the die contact pads by bonding wires, compression bonding, or other means. The outer ends of the finger contacts form the plug-in contacts or other connectible contacts of the die package.

In the industry, a need has arisen for a device having edge contacts to be provided with array contacts.

In addition, there is also a need in the industry to provide a multichip device formed by placing multiple chips in a single package.

Further, there is a need in the industry to replace the rigid standard type of printed circuit board with a flexible substrate.

Accordingly, it is an object of the present invention to provide a TAB tape translator for use with semiconductor devices which overcomes the above deficiencies.

A further object of the present invention is to provide a TAB tape translator for use with semiconductor devices which will convert an edge connector type device to an array connector type device.

Another object of the present invention is to provide a TAB tape translator for use with semiconductor devices which provides a multichip device.

Still another object of the present invention is to provide a TAB tape translator for use with semiconductor devices which is used as a printed circuit board.

Yet another object of the present invention is to provide a TAB tape translator which will reduce the input/output footprint thereby permitting more tightly packed interconnected die.

Another object of the present invention is to provide a TAB tape translator which has shorter parasitic interconnect paths permitting higher frequency operation.

SUMMARY OF THE INVENTION

The present invention consists of utilizing a TAB tape to convert an edge contact type die to an array contact type die. A TAB tape is provided having a plurality of contacts on one surface corresponding to the edge contacts of a die. On a second surface of the tape is a plurality of contacts in an array configuration. The die contacts are connected to the contacts on the first surface of the die and connectors are routed from the contacts on the first surface of the tape to the contacts on the second surface.

BRIEF DESCRIPTION OF THE DRAWINGS

FIG. 1 is a surface view of prior art edge contact semiconductor die;

FIG. 2 is a partial surface view of a prior art substrate array contact bonding area;

FIG. 3 is a partial cross sectional view of a TAB tape translator embodying the present invention;

FIG. 4 is a partial cross sectional view of a second TAB tape translator embodying the present invention;

FIG. 5 is a partial cross sectional view of a third TAB tape translator embodying the present invention;

FIG. 6 is a partial cross sectional view of a fourth TAB tape translator embodying the present invention;

FIG. 7 is a partial cross sectional view of a TAB tape translator embodying the present invention used to produce a multichip component; and FIG. 8 is a partial cross sectional view of a TAB tape translator embodying the present invention used as a printed circuit board to interconnect multiple dice.

DETAILED DESCRIPTION OF THE DRAWINGS

Referring initially to FIG. 1, a surface view of a prior art edge contact semiconductor die, generally designated 10, is illustrated. Die 10 consists of a substrate 11 and a plurality of contacts 12 disposed about the periphery thereof. In FIG. 2, a partial surface view of a prior art substrate showing the array contact bonding area, generally designated 20, is illustrated. Area 20 consists of a substrate 21 and a plurality of contacts 22. The problem illustrated by FIGS. 1 and 2 is the inability to couple die 10 to area 20.

Referring now to FIG. 3, a partial cross sectional view of a TAB tape translator, generally designated 30, is illustrated. Translator 30 consists of a substrate 31 composed of a polyimide or the like. The substrate has been processed to form vias or plated through holes therein and then fill the vias with a conductive material forming posts 32. Conductive lines 33 and bumps 34 are then formed to provide interconnection of posts 32 and bonding areas for die 10, respectively.

Die 11 is then coupled to one surface of translator 30 by connecting contact 12 to bump 34. Bump 34 on the second surface of translator 30 would then correspond to contact 22 of array 20.

In addition, translator 30 may be provided with a contact 35 for making contact with a test probe. This allows testing and burning in of the circuit of die 11 using standard test fixturing technology. Once testing is completed, the portion of substrate 31 which was provided for testing, is severed. This leaves translator 30' as illustrated in FIG. 4.

FIG. 4 also shows a compliant buffer 36 disposed between translator 30' and die 10. Buffer 36 is provided to prevent possible damaging pressure from being exerted on a portion of die 10 away from contacts 12. Buffer 36 also acts to maintain planarity of the array bumps on the opposing side of translator 30' during an assembly operation. Buffer 36 may be composed of thermally conductive material to aid in heat transference. Buffer 36 may be preformed or cast and cured in situ. Further, buffer 36 may be preattached to either the die or translator.

Referring now to FIG. 5, a partial cross sectional view of a third TAB tape translator, generally designated 30'', is illustrated. In translator 30'', additional conductive areas (reference plane regions) 37 have been added to the surfaces of substrate 31. It should be noted here that conductors 37 may not be required on both surfaces of substrate 31 and may only be provided on one surface. Conductors 37 are provided to control the impedance of conductors 33.

Another alternative embodiment of the TAB translator, generally designated 30''', is shown in FIG. 6. FIG. 6 consists of the translator, a die 10 and a substrate 46. Disposed on a surface of substrate 46 are contacts 47 and reference planes 48. A set of reference planes 37 are disposed on a surface of the translator juxtaposed to reference planes 48. Additional reference planes 45 are located on the surface of die 10 facing the translator. Matching reference planes 37' are disposed on the surface of the translator facing die 10. The reference planes are alternatively provided with different potentials. As an example, reference planes 48 and 37' may have a positive potential while reference planes 37 and 45 are provided with a negative or ground potential. Alternatively, planes 48 and 37' could be provided with a +5 volt potential while planes 37 and 45 are provided with a +1 volt potential.

The translator of FIG. 6 also contains a layer of selected dielectric 38 disposed between voltage planes of different potential. Dielectric 38 together with the reference planes provides a capacitive decoupling of the power distribution system. Typically, dielectric 38 would not be provided adjacent to transmission line 33 as this could result in cross talk or propagation delay problems. However, if cross talk and propagation delays are not a concern, dielectric 38 may be provided throughout the entire area between the translator and die 10 or substrate 46.

An additional use of the present invention is to produce a multichip component as illustrated by component 40 of in FIG. 7. Component 40 consists of translator 30 being disposed between dice 10 and 10'. Data may then be transferred between multiple components in the same package thereby reducing transmission time and improving performance. Some of conductive lines 33 would be carried out past the edges of substrates 11 and 11' to provide contact with an external package or printed circuit board. Extensions of lines 33 could be formed and act as standard input/output leads.

In addition, multichip component 40 can also be provided with buffer materials (FIG. 4), conductive planes (FIG. 5), dielectric material (FIG. 6), or the like.

A further use of the present invention is to provide a flexible printed circuit board. This is illustrated by the partial cross sectional view of a TAB translator generally designated 50. Here, translator 50 is used to interconnect dice 10 and 10' on the same surface of translator 50. By coupling a number of dice together, translator 50 is used as a flexible printed circuit board making a multichip module. It should be noted that the dice do not need to be disposed on the same surface of translator 50. Translator 50 may also be provided with a buffer material, conductive plane, dielectric, or the like.

Therefore, a translator has been shown which provides a means for converting an edge connector type device to an array connector type device. The translator means also provides a multichip device and can be used as a printed circuit board.

Thus, it will be apparent to one skilled in the art, upon reviewing the foregoing description, that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A semiconductor package comprising:
    a first semiconductor die having a plurality of electrical contacts disposed about the periphery thereof;
    a substrate having a plurality of electrical contacts disposed in an array format; and
    a flexible tape having a first plurality of electrically conductive bond pads disposed about a periphery of a first area of a first surface thereof for bonding with said plurality of electrical contacts of said first semiconductor die, a second plurality of electrically conductive bond pads disposed substantially within a first area of a second surface thereof, said first area of said first surface being aligned with said first area of said second surface, said second plurality of electrically conductive bond pads being provided for bonding with said plurality of electrical contacts of said substrate, and a plurality of conductive leads coupling said plurality of first and second electrically conductive bond pads.

2. The semiconductor package of claim 1 wherein each of said plurality of conductive leads of said flexible tape comprises a first conductive portion disposed from said first surface to said second surface of said flexible tape, a second conductive portion coupled to one of said plurality of first electrically conductive bond pads and said first conductive portion of said conductive lead, and a third conductive portion coupled to one of said plurality of second electrically conductive bond pads and said first conductive portion said conductive lead.

3. The semiconductor package of claim 1 further comprising a buffer disposed between said first semiconductor die and said flexible tape.

4. The semiconductor package of claim 1 further comprising a conductive plane disposed on said first or second surface of said flexible tape.

5. The semiconductor package of claim 1 further comprising a dielectric capacitor layer disposed between said first semiconductor die and said flexible tape.

6. The semiconductor package of claim 1 further comprising a test area of said flexible tape.

7. The semiconductor package of claim 6 wherein said test area comprises a portion of said flexible tape having a conductive test pad, said test pad being electrically coupled to said conductive lead.

8. The semiconductor package of claim 1 further comprising a second semiconductor die having a plurality of electrical contacts coupled to a third electrically conductive bond pad disposed on a first surface of said flexible tape.

9. An adaptor comprising:

a flexible tape having a first surface and a second surface opposite said first surface;

a plurality of first electrically conductive bond pads disposed about a periphery of a first area of said first surface of said flexible tape;

a plurality of second electrically conductive bond pads disposed substantially within a first area of said second surface of said flexible tape, said first area of said second surface being aligned with said first area of said first surface; and a plurality of conductive leads coupling said plurality of first and second electrically conductive bond pads.

10. The adaptor of claim 9 wherein each of said plurality of conductive leads comprises a first conductive portion disposed from said first surface to said second surface of said flexible tape, a second conductive portion coupled to one of said plurality of first electrically conductive bond pads and said first conductive portion of said conductive lead, and a third conductive portion coupled to one of said plurality of second electrically conductive bond pads and said first conductive portion said conductive lead.

11. The adaptor of claim 9 further comprising a first semiconductor die having a plurality of electrical contacts disposed about the periphery of a first surface thereof, said plurality of electrical contacts being coupled to said plurality of first electrically conductive bond pads.

12. The adaptor of claim 11 further comprising a substrate having a plurality of electrical contacts disposed in an array format, said plurality of electrical contacts being coupled to said plurality of second electrically conductive bond pads.

13. The adaptor of claim 11 further comprising a second semiconductor die having a plurality of electrical contacts, one of said plurality of electrical contacts being coupled to one of said plurality of second electrically conductive bond pads.

14. The semiconductor package of claim 11 further comprising a buffer disposed between said first semiconductor die and said flexible tape.

15. The semiconductor package of claim 11 further comprising a conductive plane disposed on said first or second surface of said flexible tape.

16. The semiconductor package of claim 11 further comprising a dielectric layer disposed between said first semiconductor die and said flexible tape.

17. The semiconductor package of claim 11 further comprising a third semiconductor die having a plurality of electrical contacts coupled to a third electrically conductive bond pad disposed on a first surface of said flexible tape.

18. The semiconductor package of claim 9 further comprising a test area of said flexible tape.

19. The semiconductor package of claim 18 wherein said test area comprises a portion of said flexible tape having a conductive test pad, said test pad being electrically coupled to said conductive lead.

* * * * *